(12) United States Patent
Duncan et al.

(10) Patent No.: US 11,363,745 B1
(45) Date of Patent: Jun. 14, 2022

(54) HOUSING FOR DISPLAY ELECTROMAGNETIC SHIELDING AND ELECTROSTATIC GROUNDING

(71) Applicant: Waymo LLC, Mountain View, CA (US)

(72) Inventors: Scott Duncan, Sunnyvale, CA (US); Prasanna Kalkura, San Jose, CA (US); Victor Tang, San Mateo, CA (US); Joongmin Yoon, Mountain View, CA (US); Tianqi Li, San Jose, CA (US)

(73) Assignee: Waymo LLC, Mountain View, CA (US)

( * ) Notice: Subject to any disclaimer, the term of this patent is extended or adjusted under 35 U.S.C. 154(b) by 0 days.

(21) Appl. No.: 16/922,836

(22) Filed: Jul. 7, 2020

(51) Int. Cl.
| | |
|---|---|
| *H05K 5/00* | (2006.01) |
| *H05K 9/00* | (2006.01) |
| *G06F 3/041* | (2006.01) |
| *H05K 5/04* | (2006.01) |
| *H05K 7/14* | (2006.01) |
| *H05K 5/02* | (2006.01) |
| *B60R 16/02* | (2006.01) |
| *H01R 13/6596* | (2011.01) |

(Continued)

(52) U.S. Cl.
CPC .......... *H05K 9/0054* (2013.01); *B60K 35/00* (2013.01); *B60R 16/02* (2013.01); *B60W 50/14* (2013.01); *B60W 60/0025* (2020.02); *G06F 3/041* (2013.01); *H01R 13/6596* (2013.01); *H05K 5/003* (2013.01); *H05K 5/0017* (2013.01); *H05K 5/0247* (2013.01); *H05K 5/04* (2013.01); *H05K 7/1427* (2013.01); *B60K 2370/1438* (2019.05); *B60W 2050/146* (2013.01); *G06F 2203/04107* (2013.01)

(58) Field of Classification Search
USPC .......................... 361/752, 799, 816, 818, 810
See application file for complete search history.

(56) References Cited

U.S. PATENT DOCUMENTS

| | | | |
|---|---|---|---|
| 5,603,620 A | * | 2/1997 | Hinze ................ H01R 13/6581 439/95 |
| 6,411,522 B1 | | 6/2002 | Frank, Jr. et al. |

(Continued)

FOREIGN PATENT DOCUMENTS

CN   101945526 B   4/2013

OTHER PUBLICATIONS

S. Geetha, K.K. Satheesh Kumar, Chepuri R. K. Rao, M. Vijayan, D. Trivedi, EMI Shielding: Methods and Materials—A Review, Journal of Applied Polymer Science, Feb. 2008, 14 pages.

*Primary Examiner* — Hung S. Bui
(74) *Attorney, Agent, or Firm* — McDonnell Boehnen Hulbert & Berghoff LLP

(57) ABSTRACT

Example embodiments described herein involve a structural support for shielding from electromagnetic interference between components in a display system and for discharging electrostatic charges. The display system may be implemented in an autonomous vehicle. A display system may include a screen, a printed circuit board (PCB), and a cast housing comprising a metal. At least the screen and the PCB may be grounded to the cast housing. The cast housing may shield at least the screen and the PCB from electromagnetic interference. A grounding cable may be connected to the cast housing via a self-tapping screw, the grounding cable extending to an electrical ground.

19 Claims, 12 Drawing Sheets

(51) Int. Cl.
*B60W 60/00* (2020.01)
*B60K 35/00* (2006.01)
*B60W 50/14* (2020.01)

(56) References Cited

U.S. PATENT DOCUMENTS

| | | | |
|---|---|---|---|
| 6,452,113 B2 | 9/2002 | Dibene, II et al. | |
| 6,470,556 B2 * | 10/2002 | Boe | H05K 7/142 |
| | | | 174/138 G |
| 6,525,266 B2 | 2/2003 | Ferland et al. | |
| 6,728,555 B1 | 4/2004 | Pirilia et al. | |
| 6,746,254 B2 * | 6/2004 | Hooper | H05K 7/142 |
| | | | 174/138 G |
| 6,782,243 B2 | 8/2004 | Shiotsu et al. | |
| 7,177,153 B2 | 2/2007 | Radosevich et al. | |
| 7,199,854 B2 | 4/2007 | Yu | |
| 7,554,815 B2 * | 6/2009 | Hardt | H05K 7/1487 |
| | | | 361/742 |
| 7,726,440 B2 | 6/2010 | Aisenbrey | |
| 7,843,526 B2 | 11/2010 | Lee et al. | |
| 8,583,187 B2 | 11/2013 | Kim et al. | |
| 8,593,821 B2 | 11/2013 | Gupta et al. | |
| 8,780,569 B2 | 7/2014 | Malo et al. | |
| 8,791,864 B2 | 7/2014 | Merz et al. | |
| 8,964,408 B2 | 2/2015 | Lee et al. | |
| 9,093,234 B2 | 7/2015 | Lynch et al. | |
| 9,155,188 B2 | 10/2015 | Merz et al. | |
| 9,250,281 B2 | 2/2016 | Tran | |
| 9,411,202 B2 * | 8/2016 | Kaneko | G02F 1/1345 |
| 2004/0014336 A1 * | 1/2004 | Merz | H01R 13/659 |
| | | | 439/76.1 |
| 2006/0181462 A1 * | 8/2006 | Kelly | H01Q 1/2258 |
| | | | 343/702 |
| 2006/0266544 A1 | 11/2006 | Tung et al. | |
| 2010/0298029 A1 * | 11/2010 | Jang | G06F 1/266 |
| | | | 455/557 |
| 2012/0162132 A1 * | 6/2012 | Chen | G06F 3/0446 |
| | | | 345/174 |
| 2013/0063600 A1 * | 3/2013 | Pawlicki | B60R 11/04 |
| | | | 348/148 |
| 2015/0029688 A1 * | 1/2015 | Fujita | G02F 1/133308 |
| | | | 361/753 |
| 2017/0048997 A1 * | 2/2017 | Morin | H01R 13/6596 |
| 2017/0365912 A1 * | 12/2017 | Su | G06F 1/1626 |
| 2018/0316087 A1 * | 11/2018 | Kim | H01Q 5/364 |

* cited by examiner

HOUSING FOR DISPLAY ELECTROMAGNETIC SHIELDING AND ELECTROSTATIC GROUNDING

BACKGROUND

Vehicles are often equipped with display systems for user input and communication between the vehicle and the user. With advances in technology, some vehicles are configured with systems that enable the vehicles to operate in a partial or fully autonomous mode. While operating in partial or fully autonomous mode, many electrical systems are at use within the vehicle. For example, display systems are frequently used for communication with a user when operating in a partial or fully autonomous mode. These display systems alone can contain multiple components packaged together including screens for user input, PCBs, backlights, and USB connector modules.

SUMMARY

In one aspect, the present application describes a display system. The display system may include a screen, a plurality of backlights, and a printed circuit board (PCB). The display system may also include a cast housing made of a metal. At least the screen, the plurality of backlights, and the PCB may be grounded to the cast housing and the cast housing may shield at least the screen and the PCB from electromagnetic interference.

In another aspect, the present application describes a display system. The display system may include a plurality of electrical components. The display system may also include a cast housing made of a metal. The electrical components may be grounded to the cast housing through a plurality of pathways and the cast housing may shield the plurality of components from electromagnetic interference.

In yet another aspect, the present application describes an autonomous vehicle display system. The autonomous vehicle display system may include a screen, a plurality of backlights, a PCB, and a plurality of USB connector modules. The autonomous vehicle display system may also include a cast housing made of a metal. At least the screen, the plurality of backlights, the PCB, and the plurality of USB connector modules may be grounded to the cast housing. The cast housing may shield at least the screen and the PCB from electromagnetic interference.

The foregoing summary is illustrative only and is not intended to be in any way limiting. In addition to the illustrative aspects, embodiments, and features described above, further aspects, embodiments, and features will become apparent by reference to the figures and the following detailed description.

BRIEF DESCRIPTION OF THE FIGURES

Example embodiments should become apparent from the following description, which is given by way of example only, of at least one preferred but non-limiting embodiment, described in connection with the accompanying figures.

DETAILED DESCRIPTION

Figure 1:
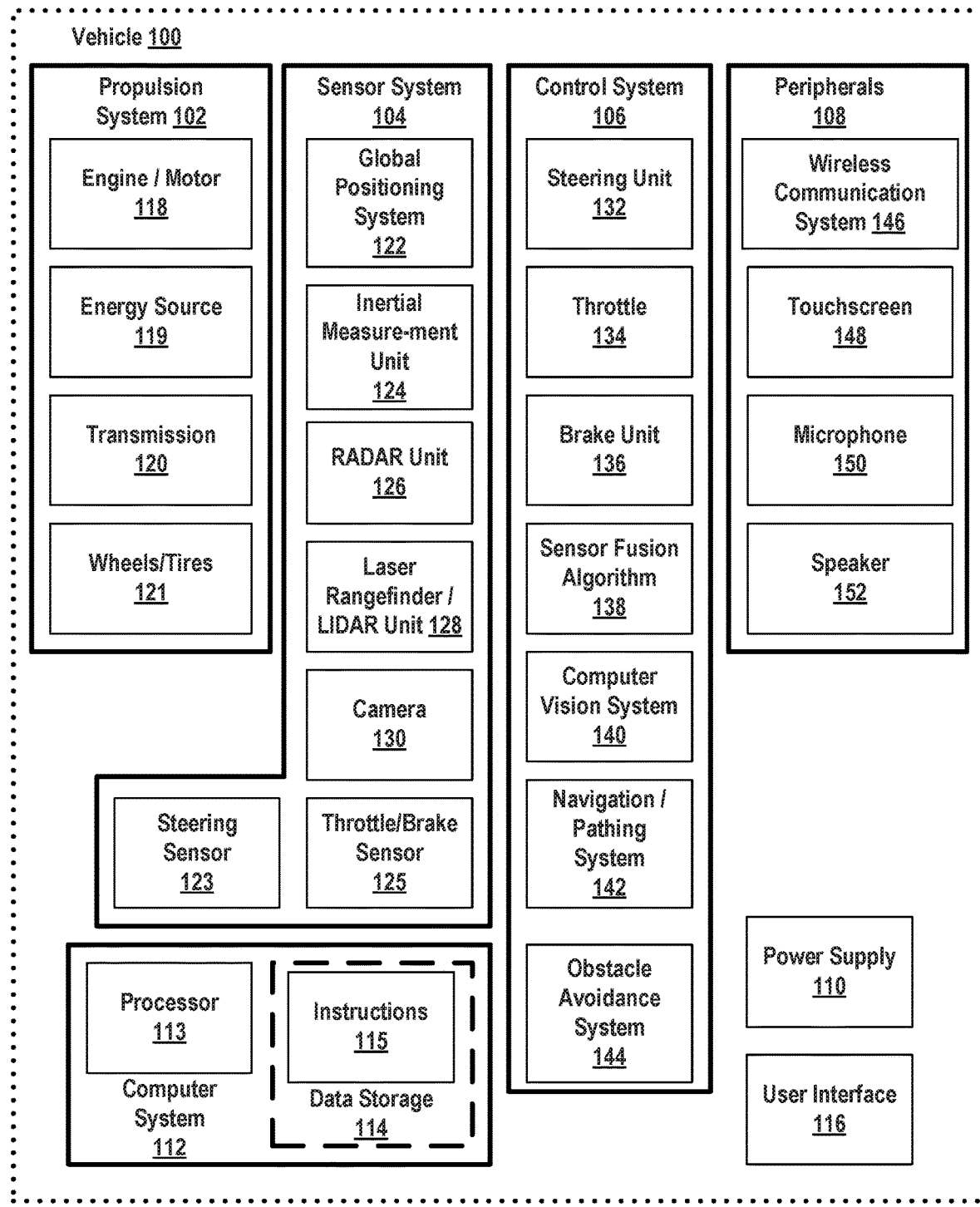
FIG. 1 is a functional block diagram illustrating a vehicle, according to one or more example embodiments.
Figure 2A:
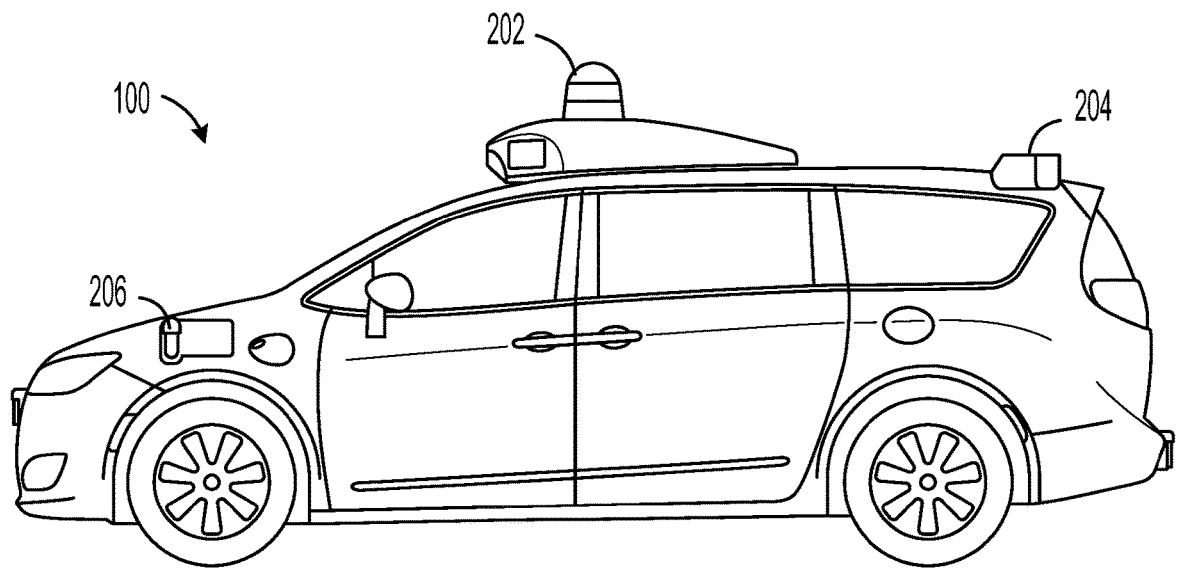
FIG. 2A illustrates a side view of a vehicle, according to one or more example embodiments.
Figure 2B:
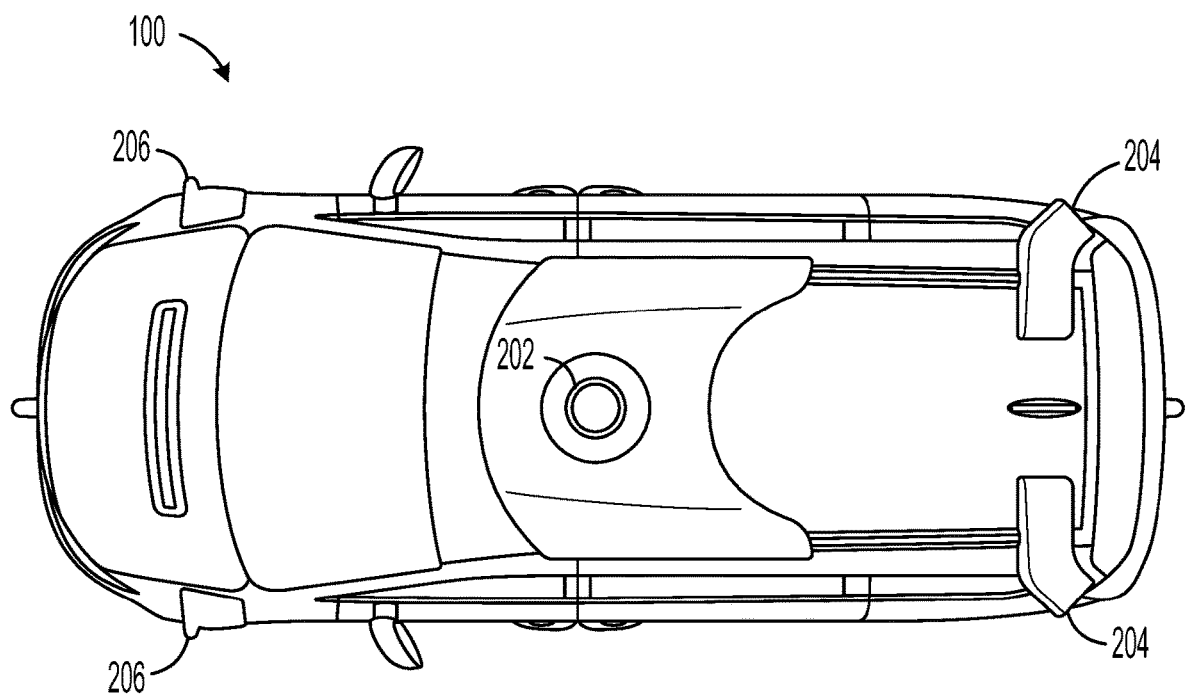
FIG. 2B illustrates a top view of a vehicle, according to one or more example embodiments.
Figure 2C:
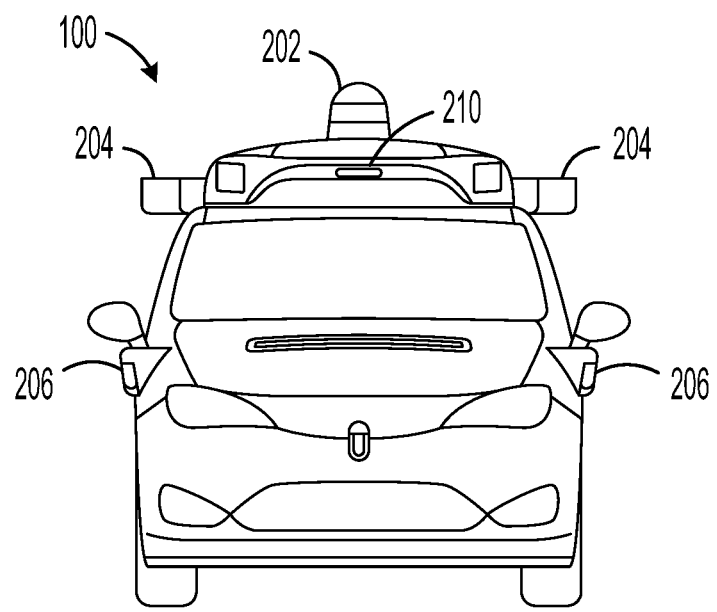
FIG. 2C illustrates a front view of a vehicle, according to one or more example embodiments.
Figure 2D:
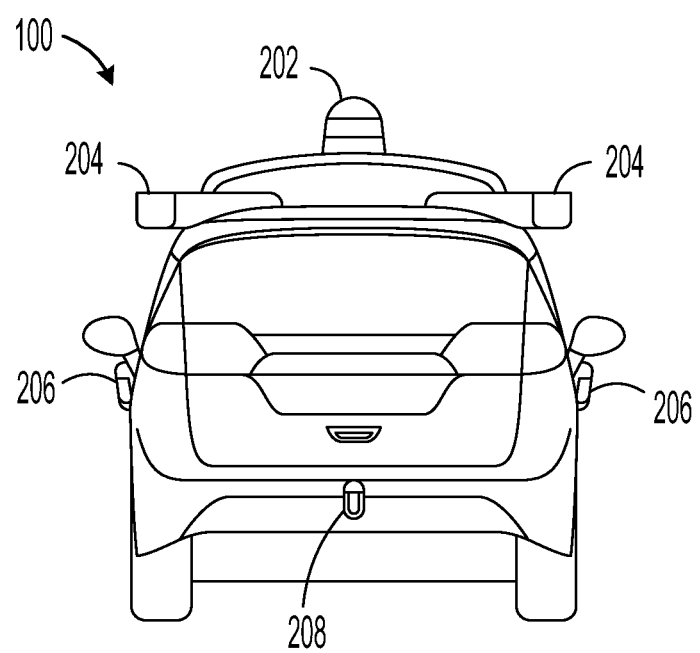
FIG. 2D illustrates a back view of a vehicle, according to one or more example embodiments.
Figure 2E:
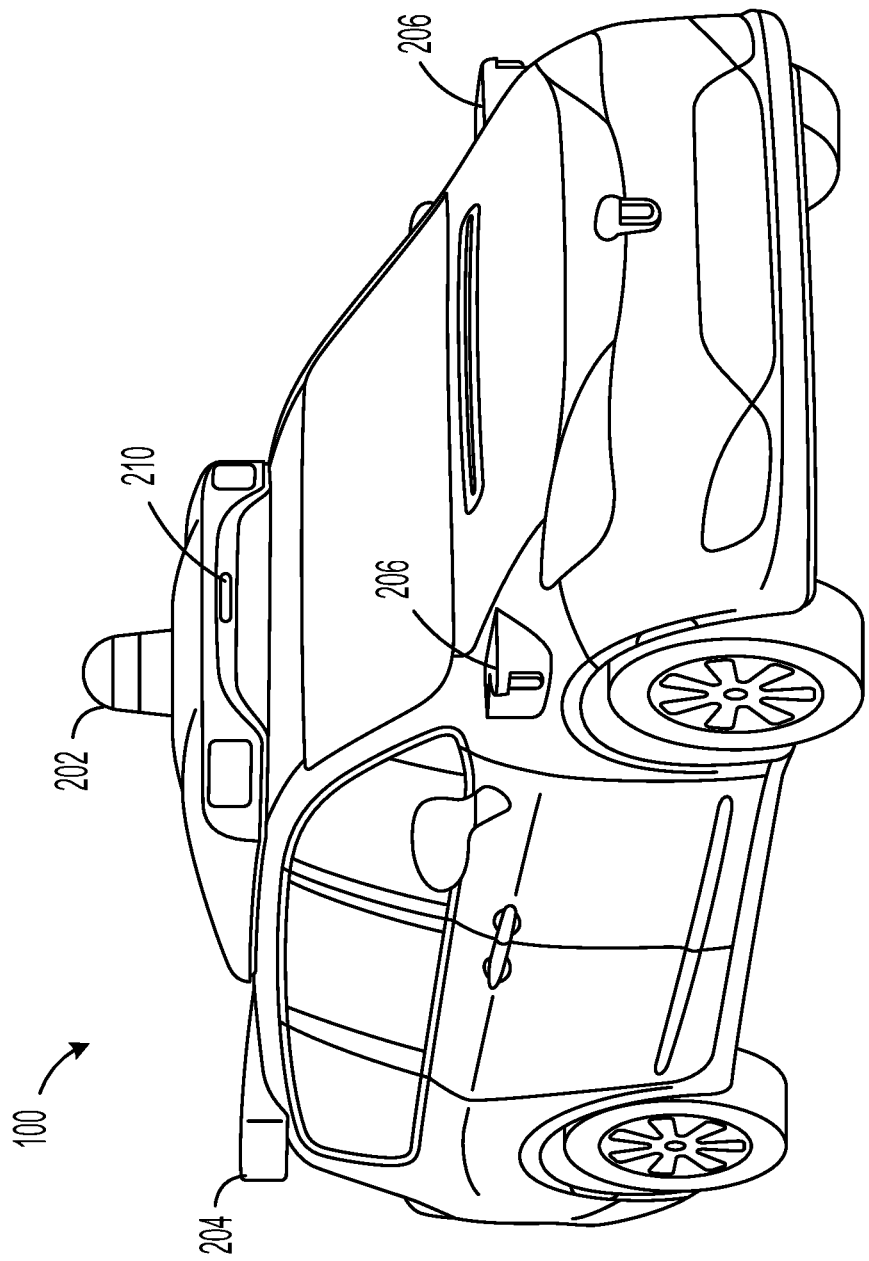
FIG. 2E illustrates an additional view of a vehicle, according to one or more example embodiments.

Example methods and systems are described herein. It should be understood that the words "example," "exemplary," and "illustrative" are used herein to mean "serving as an example, instance, or illustration." Any implementation or feature described herein as being an "example," being "exemplary," or being "illustrative" is not necessarily to be construed as preferred or advantageous over other implementations or features. The example implementations described herein are not meant to be limiting. It will be readily understood that the aspects of the present disclosure, as generally described herein, and illustrated in the figures, can be arranged, substituted, combined, separated, and designed in a wide variety of different configurations, all of which are explicitly contemplated herein. Additionally, in this disclosure, unless otherwise specified and/or unless the particular context clearly dictates otherwise, the terms "a" or "an" means at least one, and the term "the" means the at least one.

Furthermore, the particular arrangements shown in the Figures should not be viewed as limiting. It should be understood that other implementations might include more or less of each element shown in a given Figure. Further, some of the illustrated elements may be combined or omitted. Yet further, an example implementation may include elements that are not illustrated in the Figures.

An autonomous vehicle uses many electrical systems contained within the vehicle during operation. Electrical systems that carry rapidly changing electrical currents give off electromagnetic emissions. Frequently, emissions from an electrical device in an electrical system can interfere with the current of another electrical device in the system. However, in order for the autonomous vehicle to operate, the electrical systems within an autonomous vehicle should all be able to operate without interference. Electromagnetic interference between the electrical systems in an autonomous vehicle can negatively affect the operation of the vehicle. For example, electromagnetic interference could cause display black outs, short circuiting, or permanently damage electrical systems.

Electromagnetic interference can be especially difficult to control in display systems of autonomous vehicles due to the compact packaging and use of multiple electrical systems within the display systems. This may result in distorted displays on a screen of a display system, or in failure to receive user input. Because display systems in autonomous vehicles may frequently allow for user input, the need for electromagnetic compatibility and shielding becomes even more important to ensure an effective user experience. Moreover, electrostatic charges can gather on display systems during use and affect user experience.

One possible solution for shielding against electromagnetic interference is to use electromagnetic tape to tape around a screen and the PCB. However, the tape provides only minimal shielding capability and doesn't provide any structural support for the components. Therefore, a separate housing may be needed in addition to the electromagnetic tape. Furthermore, using electromagnetic tape does not provide any additional benefits such as grounding for electrostatic discharge.

The following detailed description may be used with a display system in an autonomous vehicle to provide support to the display system and reduce or prevent electromagnetic interference and electrostatic discharge. Example embodiments presented herein involve a combination of hardware components. For instance, the hardware for an example display system may include a printed circuit board (PCB) possibly including resistors, light emitting diodes (LEDs), transistors, capacitors, and inductors. The architecture for an example display system may further include a display screen, backlights, and Universal Serial Bus (USB) connectors.

In some embodiments, example display system architecture may include a cast metal housing that at least offers structural support for components within the display system, shields against electromagnetic interference, and provides for grounding of all of the components. Specifically, the cast housing may shield the screen and the PCB from electromagnetic interference from the other electrical components within the display system. The USB connector modules, which may be configured to provide charge to a user's cellular device, may be particularly important to shield from given the current moving through them.

The housing may be cast from a metal that provides increased electromagnetic shielding, and that allows for ease of casting. Casting the housing allows for the shape to be more strictly controlled and include precise dimensions and grooves. The housing can also be cast in a specific shape so as to accommodate the components needed for the display system and provide structural support for them.

Not only could the cast housing shield from electromagnetic interference from within the autonomous vehicle, it could also shield from electromagnetic interference from the environment. This may be especially important in particularly electromagnetically noisy locations. Autonomous vehicles are likely to operate in areas that are particularly noisy, such as cities and airports.

In addition to shielding from electromagnetic interference, the cast housing may also assist in discharging electrostatic charge by providing a ground for the electrical components in the display system. Grounding may be particularly beneficial for the screen of the display system. When in use, the screen may gather electrostatic charge, especially from user touch. Some example display systems may include grounding paths throughout the cast housing. The paths may ground each of the components within the display system to the cast housing. Thereby centralizing the grounds and saving on space and time and increasing reliability. Once the components are grounded to the cast housing, the cast housing may include a cable that extends to an electrical ground.

Referring now to the figures, FIG. 1 is a functional block diagram illustrating example vehicle 100. Vehicle 100 may represent a vehicle capable of operating fully or partially in an autonomous mode. More specifically, vehicle 100 may operate in an autonomous mode without human interaction (or reduced human interaction) through receiving control instructions from a computing system (e.g., a vehicle control system). As part of operating in the autonomous mode, vehicle 100 may use sensors (e.g., sensor system 104) to detect and possibly identify objects of the surrounding environment in order to enable safe navigation. In some implementations, vehicle 100 may also include subsystems that enable a driver (or a remote operator) to control operations of vehicle 100.

As shown in FIG. 1, vehicle 100 includes various subsystems, such as propulsion system 102, sensor system 104, control system 106, one or more peripherals 108, power supply 110, computer system 112, data storage 114, and user interface 116. The subsystems and components of vehicle 100 may be interconnected in various ways (e.g., wired or wireless connections). In other examples, vehicle 100 may include more or fewer subsystems. In addition, the functions of vehicle 100 described herein can be divided into additional functional or physical components, or combined into fewer functional or physical components within implementations.

Propulsion system 102 may include one or more components operable to provide powered motion for vehicle 100 and can include an engine/motor 118, an energy source 119, a transmission 120, and wheels/tires 121, among other possible components. For example, engine/motor 118 may be configured to convert energy source 119 into mechanical energy and can correspond to one or a combination of an internal combustion engine, one or more electric motors, steam engine, or Stirling engine, among other possible options. For instance, in some implementations, propulsion system 102 may include multiple types of engines and/or motors, such as a gasoline engine and an electric motor.

Energy source 119 represents a source of energy that may, in full or in part, power one or more systems of vehicle 100 (e.g., engine/motor 118). For instance, energy source 119 can correspond to gasoline, diesel, other petroleum-based fuels, propane, other compressed gas-based fuels, ethanol, solar panels, batteries, and/or other sources of electrical power. In some implementations, energy source 119 may include a combination of fuel tanks, batteries, capacitors, and/or flywheel.

Transmission 120 may transmit mechanical power from the engine/motor 118 to wheels/tires 121 and/or other possible systems of vehicle 100. As such, transmission 120 may include a gearbox, a clutch, a differential, and a drive shaft, among other possible components. A drive shaft may include axles that connect to one or more wheels/tires 121.

Wheels/tires 121 of vehicle 100 may have various configurations within example implementations. For instance, vehicle 100 may exist in a unicycle, bicycle/motorcycle, tricycle, or car/truck four-wheel format, among other possible configurations. As such, wheels/tires 121 may connect to vehicle 100 in various ways and can exist in different materials, such as metal and rubber.

Sensor system 104 can include various types of sensors, such as Global Positioning System (GPS) 122, inertial measurement unit (IMU) 124, one or more radar units 126, laser rangefinder/LIDAR unit 128, camera 130, steering sensor 123, and throttle/brake sensor 125, among other possible sensors. In some implementations, sensor system 104 may also include sensors configured to monitor internal systems of the vehicle 100 (e.g., $O_2$ monitors, fuel gauge, engine oil temperature, condition of brakes).

GPS 122 may include a transceiver operable to provide information regarding the position of vehicle 100 with respect to the Earth. IMU 124 may have a configuration that uses one or more accelerometers and/or gyroscopes and may sense position and orientation changes of vehicle 100 based on inertial acceleration. For example, IMU 124 may detect a pitch and yaw of the vehicle 100 while vehicle 100 is stationary or in motion.

Radar unit 126 may represent one or more systems configured to use radio signals to sense objects (e.g., radar signals), including the speed and heading of the objects, within the local environment of vehicle 100. As such, radar unit 126 may include one or more radar units equipped with one or more antennas configured to transmit and receive radar signals as discussed above. In some implementations, radar unit 126 may correspond to a mountable radar system configured to obtain measurements of the surrounding environment of vehicle 100. For example, radar unit 126 can include one or more radar units configured to couple to the underbody of a vehicle.

Laser rangefinder/LIDAR 128 may include one or more laser sources, a laser scanner, and one or more detectors, among other system components, and may operate in a coherent mode (e.g., using heterodyne detection) or in an incoherent detection mode. Camera 130 may include one or more devices (e.g., still camera or video camera) configured to capture images of the environment of vehicle 100.

Steering sensor 123 may sense a steering angle of vehicle 100, which may involve measuring an angle of the steering wheel or measuring an electrical signal representative of the angle of the steering wheel. In some implementations, steering sensor 123 may measure an angle of the wheels of the vehicle 100, such as detecting an angle of the wheels with respect to a forward axis of the vehicle 100. Steering sensor 123 may also be configured to measure a combination (or a subset) of the angle of the steering wheel, electrical signal representing the angle of the steering wheel, and the angle of the wheels of vehicle 100.

Throttle/brake sensor 125 may detect the position of either the throttle position or brake position of vehicle 100. For instance, throttle/brake sensor 125 may measure the angle of both the gas pedal (throttle) and brake pedal or may measure an electrical signal that could represent, for instance, the angle of the gas pedal (throttle) and/or an angle of a brake pedal. Throttle/brake sensor 125 may also measure an angle of a throttle body of vehicle 100, which may include part of the physical mechanism that provides modulation of energy source 119 to engine/motor 118 (e.g., a butterfly valve or carburetor). Additionally, throttle/brake sensor 125 may measure a pressure of one or more brake pads on a rotor of vehicle 100 or a combination (or a subset) of the angle of the gas pedal (throttle) and brake pedal, electrical signal representing the angle of the gas pedal (throttle) and brake pedal, the angle of the throttle body, and the pressure that at least one brake pad is applying to a rotor of vehicle 100. In other embodiments, throttle/brake sensor 125 may be configured to measure a pressure applied to a pedal of the vehicle, such as a throttle or brake pedal.

Control system 106 may include components configured to assist in navigating vehicle 100, such as steering unit 132, throttle 134, brake unit 136, sensor fusion algorithm 138, computer vision system 140, navigation/pathing system 142, and obstacle avoidance system 144. More specifically, steering unit 132 may be operable to adjust the heading of vehicle 100, and throttle 134 may control the operating speed of engine/motor 118 to control the acceleration of vehicle 100. Brake unit 136 may decelerate vehicle 100, which may involve using friction to decelerate wheels/tires 121. In some implementations, brake unit 136 may convert kinetic energy of wheels/tires 121 to electric current for subsequent use by a system or systems of vehicle 100.

Sensor fusion algorithm 138 may include a Kalman filter, Bayesian network, or other algorithms that can process data from sensor system 104. In some implementations, sensor fusion algorithm 138 may provide assessments based on incoming sensor data, such as evaluations of individual objects and/or features, evaluations of a particular situation, and/or evaluations of potential impacts within a given situation.

Computer vision system 140 may include hardware and software operable to process and analyze images in an effort to determine objects, environmental objects (e.g., stop lights, road way boundaries, etc.), and obstacles. As such, computer vision system 140 may use object recognition, Structure From Motion (SFM), video tracking, and other algorithms used in computer vision, for instance, to recognize objects, map an environment, track objects, estimate the speed of objects, etc.

Navigation/pathing system 142 may determine a driving path for vehicle 100, which may involve dynamically adjusting navigation during operation. As such, navigation/pathing system 142 may use data from sensor fusion algorithm 138, GPS 122, and maps, among other sources to navigate vehicle 100. Obstacle avoidance system 144 may evaluate potential obstacles based on sensor data and cause systems of vehicle 100 to avoid or otherwise negotiate the potential obstacles.

As shown in FIG. 1, vehicle 100 may also include peripherals 108, such as wireless communication system 146, touchscreen 148, microphone 150, and/or speaker 152. Peripherals 108 may provide controls or other elements for a user to interact with user interface 116. For example, touchscreen 148 may provide information to users of vehicle 100. User interface 116 may also accept input from the user via touchscreen 148. Peripherals 108 may also enable vehicle 100 to communicate with devices, such as other vehicle devices.

Wireless communication system 146 may wirelessly communicate with one or more devices directly or via a communication network. For example, wireless communication system 146 could use 3G cellular communication, such as CDMA, EVDO, GSM/GPRS, or 4G cellular communications, such as WiMAX or LTE. Alternatively, wireless communication system 146 may communicate with a wireless local area network (WLAN) using WiFi or other possible connections. Wireless communication system 146 may also communicate directly with a device using an infrared link, Bluetooth, or ZigBee, for example. Other wireless protocols, such as various vehicular communication systems, are possible within the context of the disclosure. For example, wireless communication system 146 may include one or more dedicated short-range communications (DSRC) devices that could include public and/or private data communications between vehicles and/or roadside stations.

Vehicle 100 may include power supply 110 for powering components. Power supply 110 may include a rechargeable lithium-ion or lead-acid battery in some implementations. For instance, power supply 110 may include one or more batteries configured to provide electrical power. Vehicle 100 may also use other types of power supplies. In an example implementation, power supply 110 and energy source 119 may be integrated into a single energy source.

Vehicle 100 may also include computer system 112 to perform operations, such as operations described therein. As such, computer system 112 may include at least one processor 113 (which could include at least one microprocessor) operable to execute instructions 115 stored in a non-transitory computer readable medium, such as data storage 114. In some implementations, computer system 112 may represent a plurality of computing devices that may serve to control individual components or subsystems of vehicle 100 in a distributed fashion.

In some implementations, data storage 114 may contain instructions 115 (e.g., program logic) executable by processor 113 to execute various functions of vehicle 100, including those described above in connection with FIG. 1. Data storage 114 may contain additional instructions as well, including instructions to transmit data to, receive data from, interact with, and/or control one or more of propulsion system 102, sensor system 104, control system 106, and peripherals 108.

In addition to instructions 115, data storage 114 may store data such as roadway maps, path information, among other information. Such information may be used by vehicle 100 and computer system 112 during the operation of vehicle 100 in the autonomous, semi-autonomous, and/or manual modes.

Vehicle 100 may include user interface 116 for providing information to or receiving input from a user of vehicle 100. User interface 116 may control or enable control of content and/or the layout of interactive images that could be displayed on touchscreen 148. Further, user interface 116 could include one or more input/output devices within the set of peripherals 108, such as wireless communication system 146, touchscreen 148, microphone 150, and speaker 152.

Computer system 112 may control the function of vehicle 100 based on inputs received from various subsystems (e.g., propulsion system 102, sensor system 104, and control system 106), as well as from user interface 116. For example, computer system 112 may utilize input from sensor system 104 in order to estimate the output produced by propulsion system 102 and control system 106. Depending upon the embodiment, computer system 112 could be operable to monitor many aspects of vehicle 100 and its subsystems. In some embodiments, computer system 112 may disable some or all functions of the vehicle 100 based on signals received from sensor system 104.

The components of vehicle 100 could be configured to work in an interconnected fashion with other components within or outside their respective systems. For instance, in an example embodiment, camera 130 could capture a plurality of images that could represent information about a state of an environment of vehicle 100 operating in an autonomous mode. The state of the environment could include parameters of the road on which the vehicle is operating. For example, computer vision system 140 may be able to recognize the slope (grade) or other features based on the plurality of images of a roadway. Additionally, the combination of GPS 122 and the features recognized by computer vision system 140 may be used with map data stored in data storage 114 to determine specific road parameters. Further, radar unit 126 may also provide information about the surroundings of the vehicle.

In other words, a combination of various sensors (which could be termed input-indication and output-indication sensors) and computer system 112 could interact to provide an indication of an input provided to control a vehicle or an indication of the surroundings of a vehicle.

In some embodiments, computer system 112 may make a determination about various objects based on data that is provided by systems other than the radio system. For example, vehicle 100 may have lasers or other optical sensors configured to sense objects in a field of view of the vehicle. Computer system 112 may use the outputs from the various sensors to determine information about objects in a field of view of the vehicle, and may determine distance and direction information to the various objects. Computer system 112 may also determine whether objects are desirable or undesirable based on the outputs from the various sensors.

Although FIG. 1 shows various components of vehicle 100, i.e., wireless communication system 146, computer system 112, data storage 114, and user interface 116, as being integrated into the vehicle 100, one or more of these components could be mounted or associated separately from vehicle 100. For example, data storage 114 could, in part or in full, exist separate from vehicle 100. Thus, vehicle 100 could be provided in the form of device elements that may be located separately or together. The device elements that make up vehicle 100 could be communicatively coupled together in a wired and/or wireless fashion.

FIGS. 2A, 2B, 2C, 2D, and 2E illustrate different views of a physical configuration of vehicle 100. The various views are included to depict example sensor positions 202, 204, 206, 208, 210 on vehicle 100. In other examples, sensors can have different positions on vehicle 100. Although vehicle 100 is depicted in FIGS. 2A-2E as a van, vehicle 100 can have other configurations within examples, such as a truck, a car, a semi-trailer truck, a motorcycle, a bus, a shuttle, a golf cart, an off-road vehicle, robotic device, or a farm vehicle, among other possible examples.

As discussed above, vehicle 100 may include sensors coupled at various exterior locations, such as sensor positions 202-210. Vehicle sensors include one or more types of sensors with each sensor configured to capture information from the surrounding environment or perform other operations (e.g., communication links, obtain overall positioning information). For example, sensor positions 202-210 may serve as locations for any combination of one or more cameras, radars, LIDARs, range finders, radio devices (e.g., Bluetooth and/or 802.11), and acoustic sensors, among other possible types of sensors.

When coupled at the example sensor positions 202-210 shown in FIGS. 2A-2E, various mechanical fasteners may be used, including permanent or non-permanent fasteners. For example, bolts, screws, clips, latches, rivets, anchors, and other types of fasteners may be used. In some examples, sensors may be coupled to the vehicle using adhesives. In further examples, sensors may be designed and built as part of the vehicle components (e.g., parts of the vehicle mirrors).

In some implementations, one or more sensors may be positioned at sensor positions 202-210 using movable mounts operable to adjust the orientation of one or more sensors. A movable mount may include a rotating platform that can rotate sensors so as to obtain information from multiple directions around vehicle 100. For instance, a sensor located at sensor position 202 may use a movable mount that enables rotation and scanning within a particular range of angles and/or azimuths. As such, vehicle 100 may include mechanical structures that enable one or more sensors to be mounted atop the roof of vehicle 100. Additionally, other mounting locations are possible within examples.

Figure 3A:
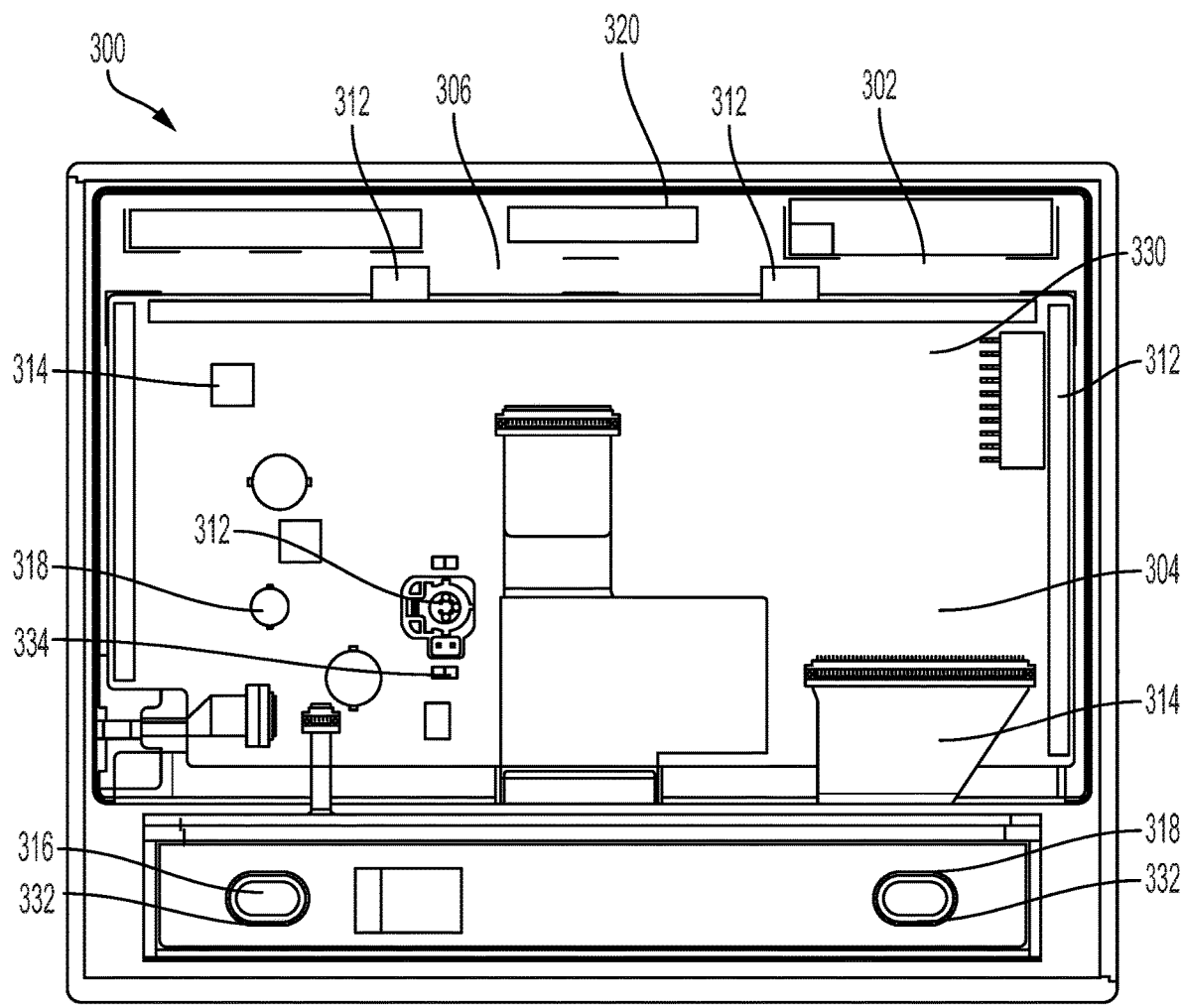
FIG. 3A illustrates a top view of a display system, according to one or more example embodiments.

FIG. 3A illustrates a layout of a display system 300, according to one or more embodiments. The display system 300 may include a screen 302 which may be the main interface of the display system 300. The screen 302 is illustrated as a top transparent layer of FIG. 3A. The screen 302 may display information in visual or tactile form. In one embodiment the screen may be for a light-emitting diode backlit liquid crystal display. The screen may also be any other compatible type of display. For example, the display could be an electroluminescent display, a liquid crystal display, a light emitting diode display, a plasma display, or a quantum dot display. The display system 300 may further include a plurality of backlights 332. The plurality of backlights may be LEDs and may be used in a variety of aspects of the display. For example, the backlights may be used for rings around USB connectors to illuminate the USB ports, and/or as a logo backlight. The display system 300 may further include a PCB 304. In an example embodiment, the PCB 304 may be multi-layered.

In one embodiment, at least the screen 302 and the PCB 304 are grounded to a cast housing 306 of the display system 300 through a plurality of pathways 312. The screen and the PCB may be electrically grounded through the same pathway to the cast housing. Alternatively, the screen and the PCB may be grounded through different pathways to the cast housing. In addition to electrically grounding the screen 302 and the PCB 304, in an example embodiment, the cast housing 306 may also shield at least the screen 302 and the PCB 304 from electromagnetic interference. To assist in shielding, the cast housing may be made of a metal that blocks electromagnetic waves. In an example embodiment, the metal used for the cast housing may be any metal that is capable of being cast and also effective for shielding against electromagnetic waves. For example, the metal of the cast housing could be any of aluminum, magnesium, steel or an alloy thereof. The housing may be cast to provide a shape that the electrical components can fit within. Alternatively, the housing may be formed in a different manner. For example, the housing could be formed by stamping.

In order to protect the PCB and the screen from electromagnetic waves, the housing may fully cover the PCB and the screen. In an example embodiment, the housing may be substantially solid. For example, the housing might cover the bottom of the PCB and the screen. Alternatively, the housing may be formed so that the PCB and the screen sit inside of it.

In some embodiments, the screen may be the main communication interface between the autonomous vehicle and a user, therefore it may be desirable for the screen 302 to be a touch screen 330 configured to accept user touch. There are various types of touch screens that may be compatible for the displays system. For example, the screen may be a resistive touch screen, a surface capacitive touch screen, a projected capacitive touch screen, a surface acoustic wave touch screen, or an infrared touch screen. Because the touch screen is the major point of interfacing with the autonomous vehicle, the touch screen may be configured to accept user input. The autonomous vehicle may then take the user input gathered from the touch screen into consideration while operating the autonomous vehicle.

Figure 3B:
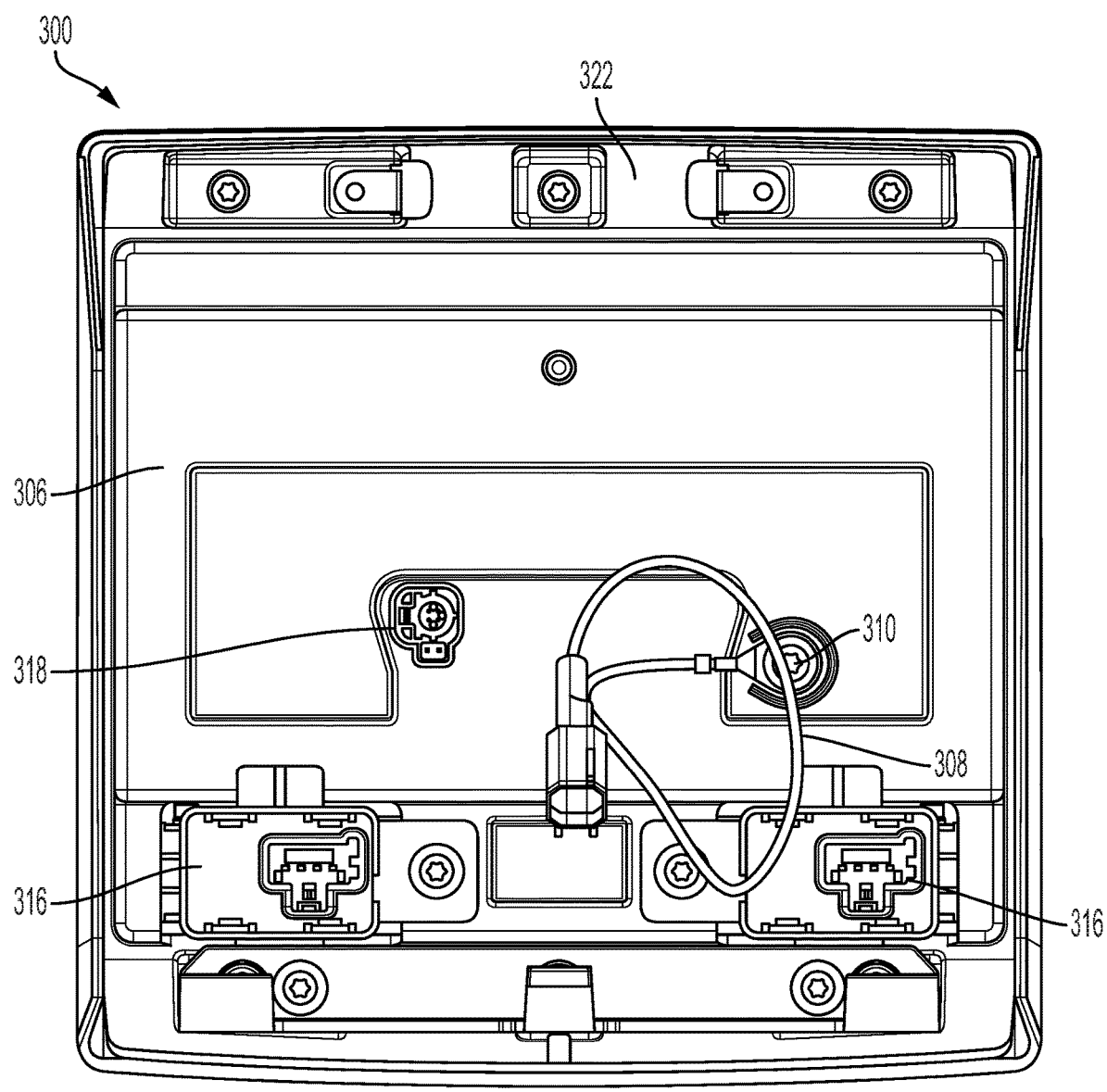
FIG. 3B illustrates a bottom view of a display system, according to one or more example embodiments.

In an example embodiment of the display system, as shown in FIG. 3B, the display system 300 further includes a grounding cable 308 connected to the cast housing 306 and extending to an electrical ground. The grounding cable 308 may discharge electrostatic charges that collect on the display system 300. All of the static from each component may be channeled through the housing to the grounding cable. The grounding cable may be made of any suitable material so as to conduct electricity and effectively discharge electrostatic charges on the display system to ground. For example, the cable may be made of a metal such as copper, steel, or aluminum. The grounding cable may be connected to the cast housing in various manners. In an example embodiment the grounding cable 308 is connected to the cast housing 306 via a self-tapping screw 310. The self-tapping screw is capable of entering the cast housing without the need for a pre-drilled hole. Additionally, the self-tapping screw does not contribute to debris entering the display system. Alternatively, the grounding cable could be connected to the cast housing with a conductive adhesive, a non-self-tapping screw, a nail, or integrally formed with the cast housing.

Figure 4:
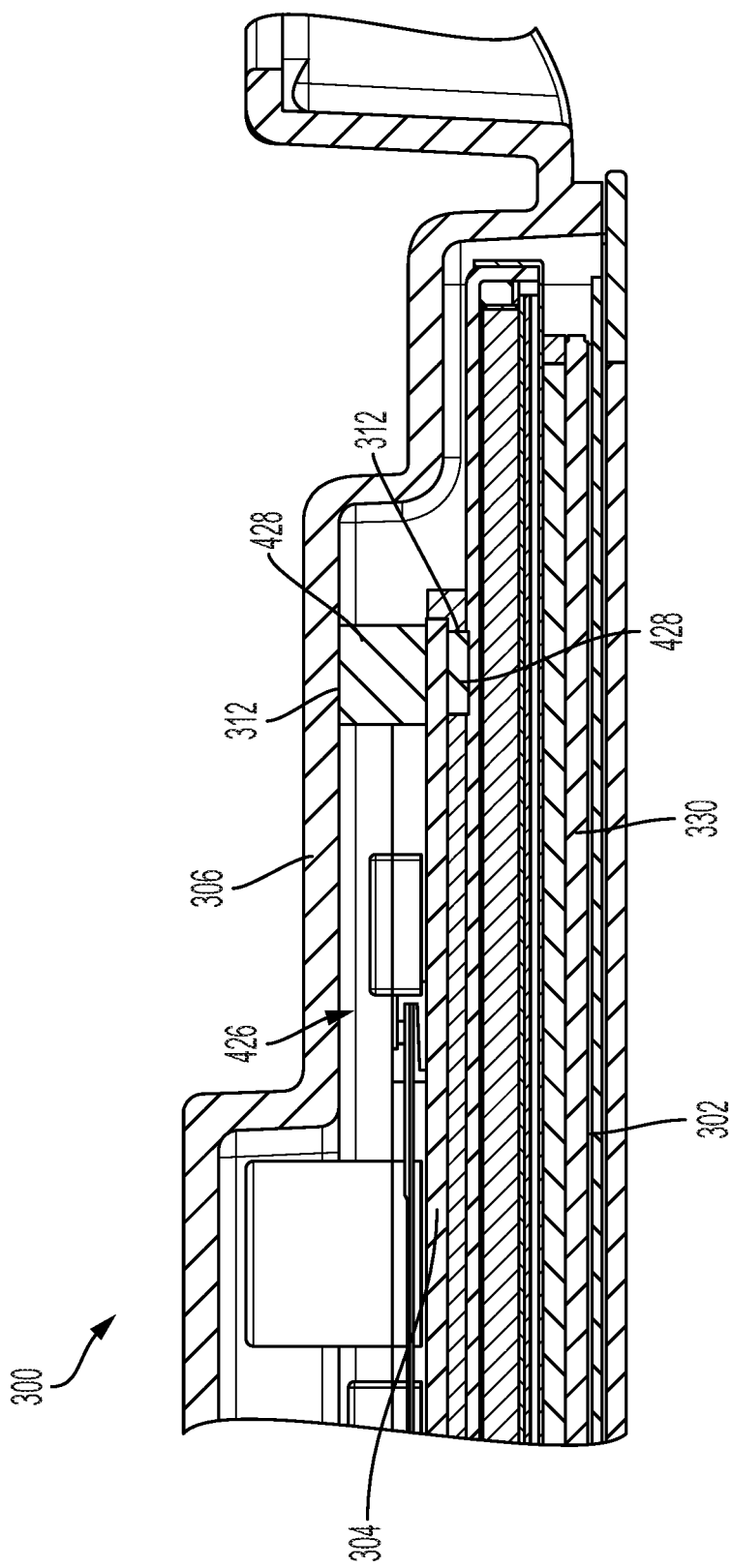
FIG. 4 illustrates a side sectional view of a display system, according to one or more example embodiments.

FIG. 4 illustrates a plurality of pathways 312 included in the display system 300 through which at least the screen 302, the plurality of backlights, and the PCB 304 may be grounded to the cast housing 300. The pathways 312 ultimately ground at least the screen 302 and the PCB 304 to the cast housing 306 concurrently and utilize the cast housing 306 as the dominant grounding path. Electrostatic build up on the screen 302, the plurality of backlights, and the PCB 304 may be discharged through the plurality of pathways to the grounding cable 308. In an example embodiment, at least one of the screen 302 and/or the plurality of backlights is grounded to the cast housing 300 via the PCB 304. The screen and the plurality of backlights may be grounded to the PCB and the PCB may be grounded to the cast housing. Thus the screen and the plurality of backlights might be grounded through the PCB. The plurality of pathways may extend through the PCB 304 to the cast housing 306 via metal spring finger pins 334.

In addition to the screen 302 and the PCB 304, the display system 300 may include at least a plurality of components 314, as shown in FIG. 3B. The plurality of components 314 may be a plurality of electrical components 318. The plurality of electrical components 318 may include at least the screen 302, the plurality of backlights 332, and the PCB 304 and be grounded to the cast housing 306.

The grounding efforts assist in reducing complications due to electrostatic discharge. During operation, electrostatic charges may build up on the touch screen and may negatively affect the performance of the display system. For example, electrostatic charges that have built up may subsequently discharge on a user causing a painful shock. Electrostatic charges can also cause screen blanks. Therefore, in an effort to reduce these problems, electrostatic build up on the plurality of components may be discharged through the plurality of pathways to the grounding cable.

Since the display system is configured to accept user input, it may also be beneficial for the display system to be compatible with user cellular devices. In an example embodiment of the display system 300, the display system 300 may include a plurality of USB connector modules 316 grounded to the cast housing 306. The USB connectors may be compatible with cellular devices. For example, the USB connectors may be used as a charging port for a cellular device. Various types of charging ports may be compatible with the display system. In an alternative embodiment, the display system may be equipped with an alternate charging port.

Because the USB connector modules may be used to charge cellular devices, the USB connector modules may be a source of electromagnetic waves. The waves from the USB connector modules may be a possible risk for interfering with the PCB and the screen. However, in an example embodiment, the cast housing 306 shields at least the screen 302 and the PCB 304 from electromagnetic interference from the USB connector modules 316. In order to shield the screen and the PCB, the USB connector modules may be disposed on a side opposite the screen and the PCB on the cast housing. In an example embodiment, the cast housing 306 may include a first side 320 and a second side 322. A shown in FIG. 3A, the screen 302 and the PCB 304 may be disposed on the first side 320 of the cast housing 306. FIG. 3B illustrates the plurality of USB connector modules 316 disposed on the second side 322 of the cast housing 306 such that the cast housing 306 is disposed between the screen 302 and PCB 304 and the USB connector modules 316. The orientation of the cast housing between components that may have electromagnetic interference assists in eliminating the interference.

Figure 5:
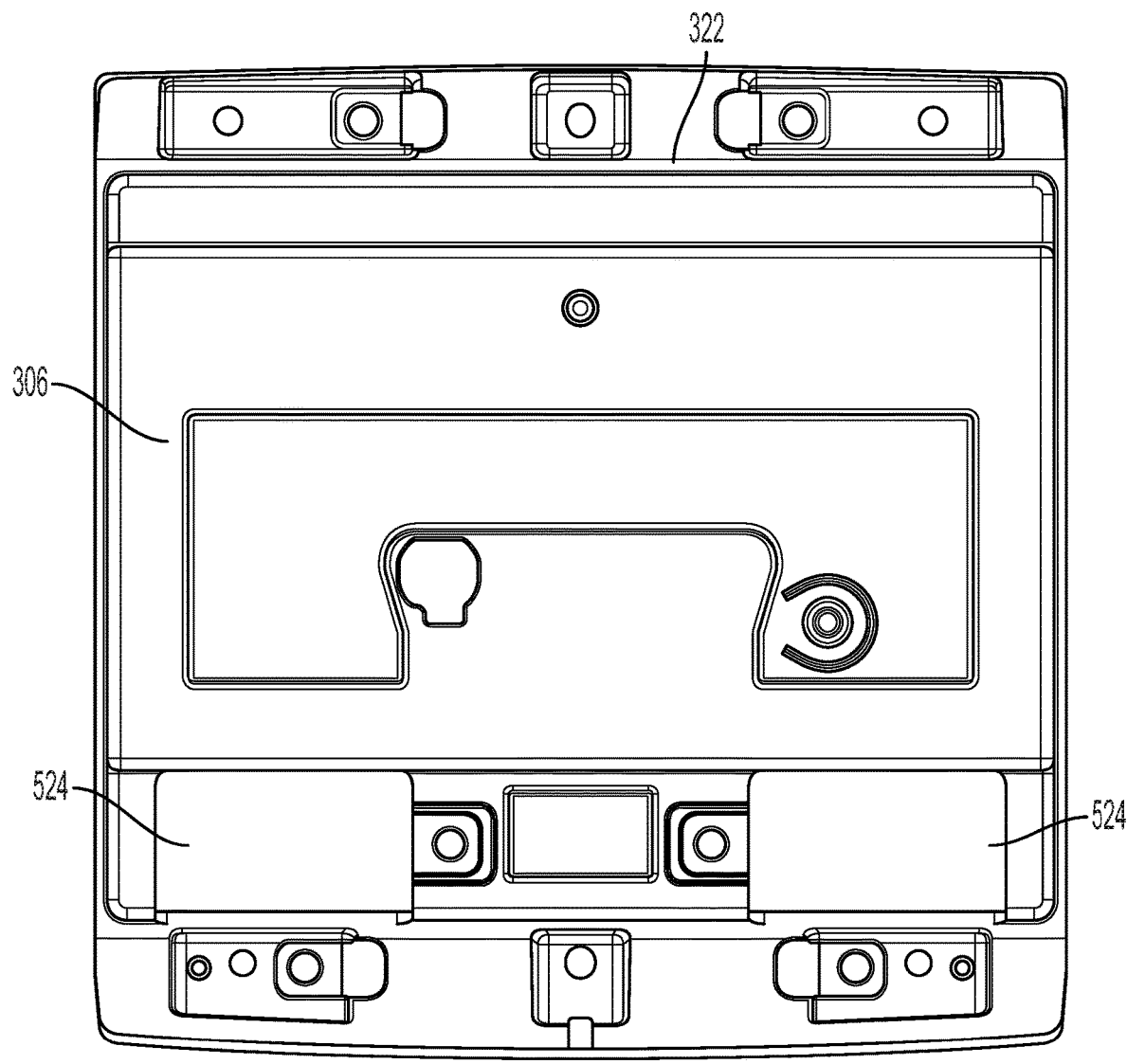
FIG. 5 illustrates a cast housing of a display system, according to one or more example embodiments.

FIG. 5 illustrates an embodiment of the cast housing 306 of the display system 300. The cast housing may be substantially solid to better shield from electromagnetic interference. However, the cast housing may include minimal cut outs to allow components to extend through the housing while still shielding. For example, the cast housing 306 may include a plurality of cut outs 524 for the plurality of USB connector modules 316 to pass through. The USB connector modules may be disposed on the second side of the cast housing and may extend through to the first side of the cast housing. This may make the USB accessible for a user to plug into a USB port. However, only the port of the USB connector module may extend through to the first side of the cast housing and the remainder of the module may remain on the second side. In an alternative embodiment, the USB connectors do not extend through the cast housing and are instead contained to one side of the cast housing.

When the USB connectors extend through the cast housing, additional measures may be taken to protect the screen and the PCB from electromagnetic interference. In an example embodiment, the PCB 304 is positioned in a recess 426 of the cast housing 306. For example, FIG. 4 illustrates the recess 426 of the cast housing 306. The recess of the cast housing may assist in shielding from electromagnetic interference of the USB connector modules if, for example, the USB connector modules extend through the cast housing. In an alternative embodiment, the cast housing may include a barrier surrounding the screen and the PCB to shield it from electromagnetic interference.

Figure 6:
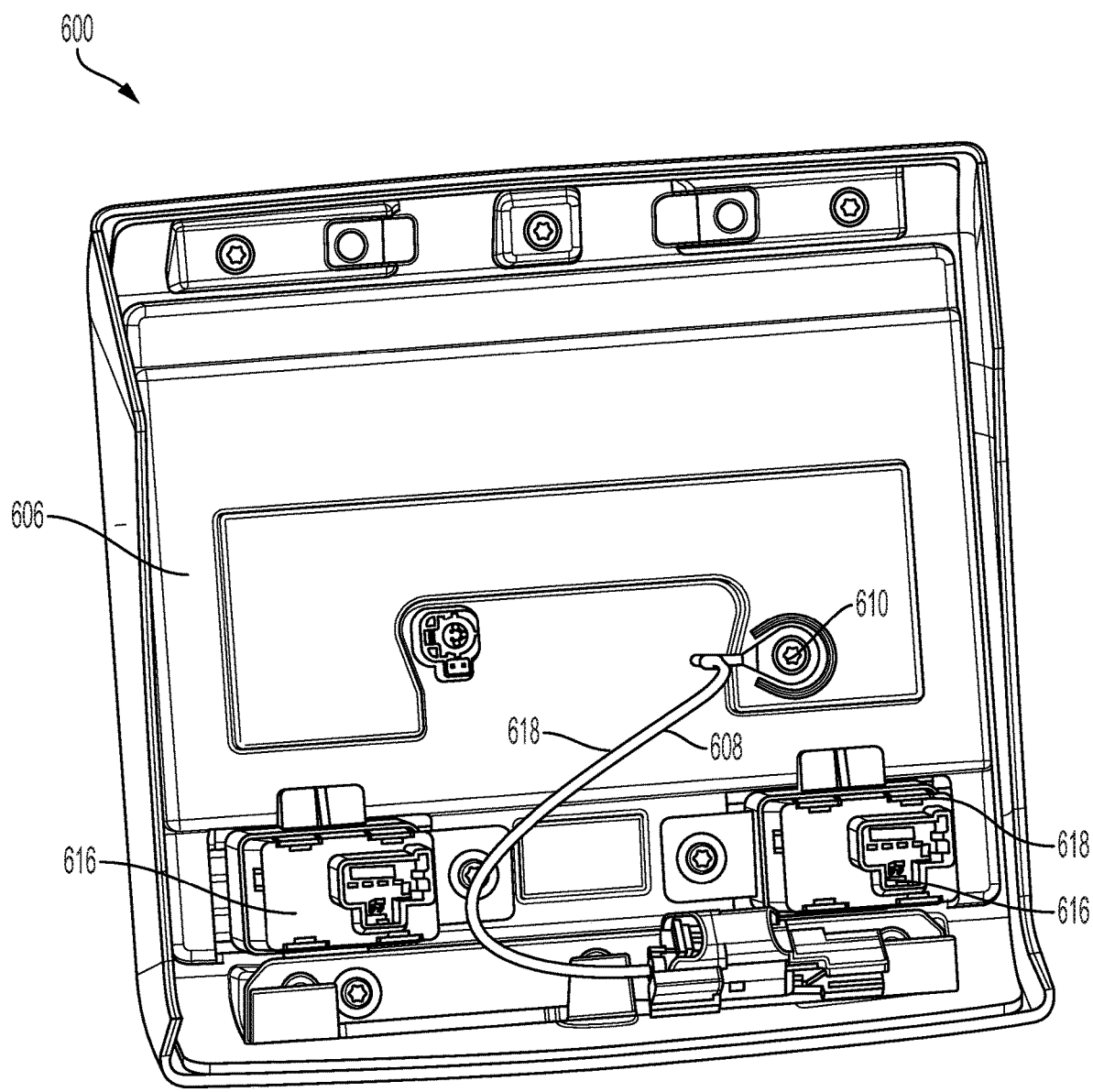
FIG. 6 illustrates an alternate bottom view of a display system, according to one or more example embodiments.

FIG. 6 illustrates a layout of a display system 600, according to one or more embodiments. As shown, the display system 600 includes a plurality of electrical components 618. The electrical components could be various devices configured to operate in a display. For example, the electrical components may be a display screen, backlights, PCBs, or USB connector modules. The display system 600 may further include a cast housing 606 made of metal. The cast housing may be formed out of various kinds of metal, including steel, aluminum alloys, copper alloys, or magnesium alloys. The electrical components may be grounded to the cast housing through a plurality of pathways and the cast housing 606 may shield the plurality of components from electromagnetic interference.

A further shown in FIG. 6, the display system 600 includes a grounding cable 608 connected to the cast housing 606. The grounding cable 608 may extend to an electrical ground and provide a pathway for electrostatic charges on the display system 600 to discharge. The grounding cable may be made out of various materials. Given that the cable may be used to discharge electrostatic charges, materials that are known for their conductive properties may be beneficial to use for the cable. In an example embodiment, the grounding cable 608 may be made out of copper insulated in PVC. Moreover, the grounding cable may be connected to the housing in various manners. In an example embodiment the grounding cable 608 is connected to the cast housing 606 via a self-tapping screw 610. The self-tapping screw may eliminate the need for a pre-drilled hole. Additionally, the self-tapping screw may not contribute to debris entering the display system.

Figure 7:
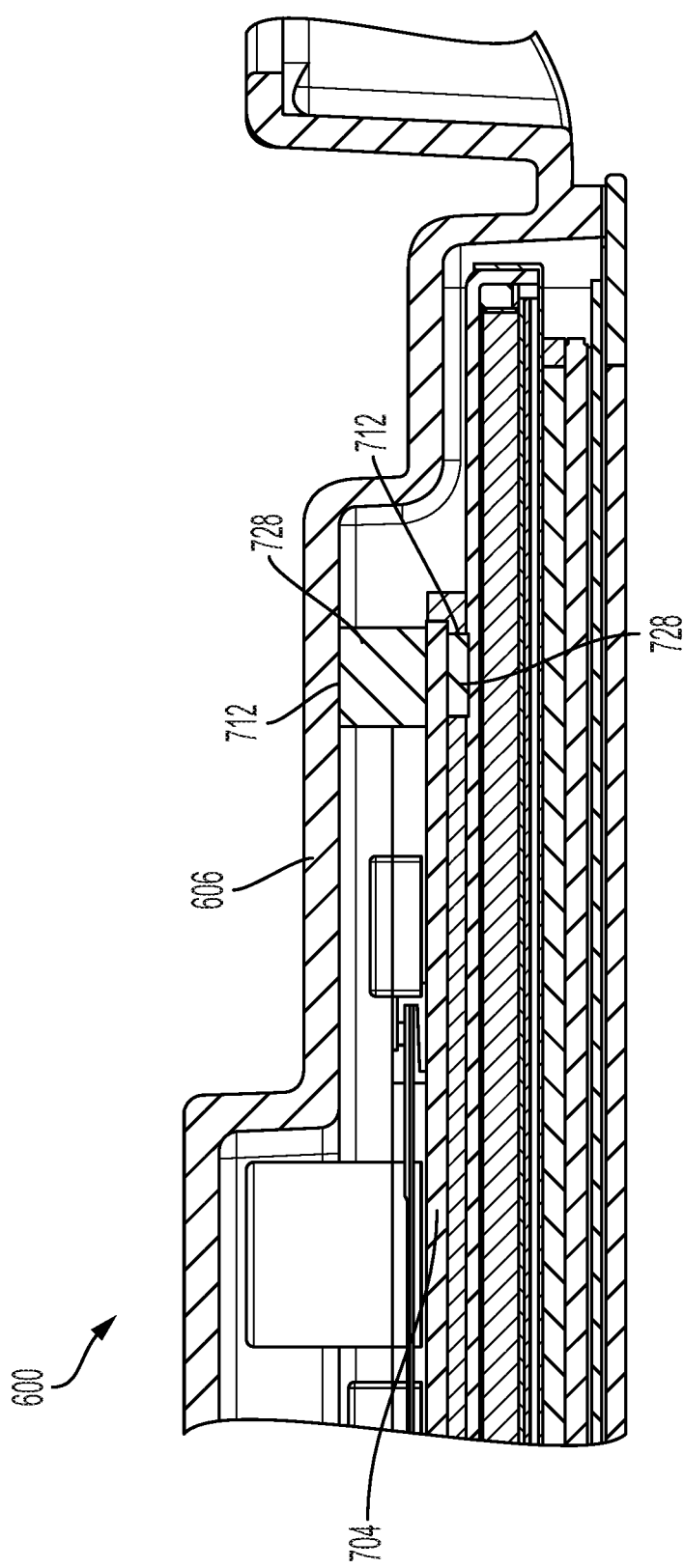
FIG. 7 illustrates a side sectional view of a display system, according to one or more example embodiments.

In an example embodiment, the plurality of pathways 712 may be grounding layers 728. FIG. 7 illustrates a layer on either side of the PCB 704 which may ground the PCB 704 to the cast housing 606. The grounding layer may be made of various materials. Foam or fabric may be used as the layer to cushion the electrical components against the cast housing. In an alternative embodiment, copper could be used for the grounding layers because of its conductive properties. Any buildup of electrostatic charges on the plurality of components may flow through the grounding layers to the grounding cable, instead of discharging on a user for example. The electrostatic buildup may discharge through the grounding layers to the grounding cable and therefore reach an electrical ground. The layers may be configured such that the electrical components discharge through common pathways that are grounding layers.

Figure 8A:
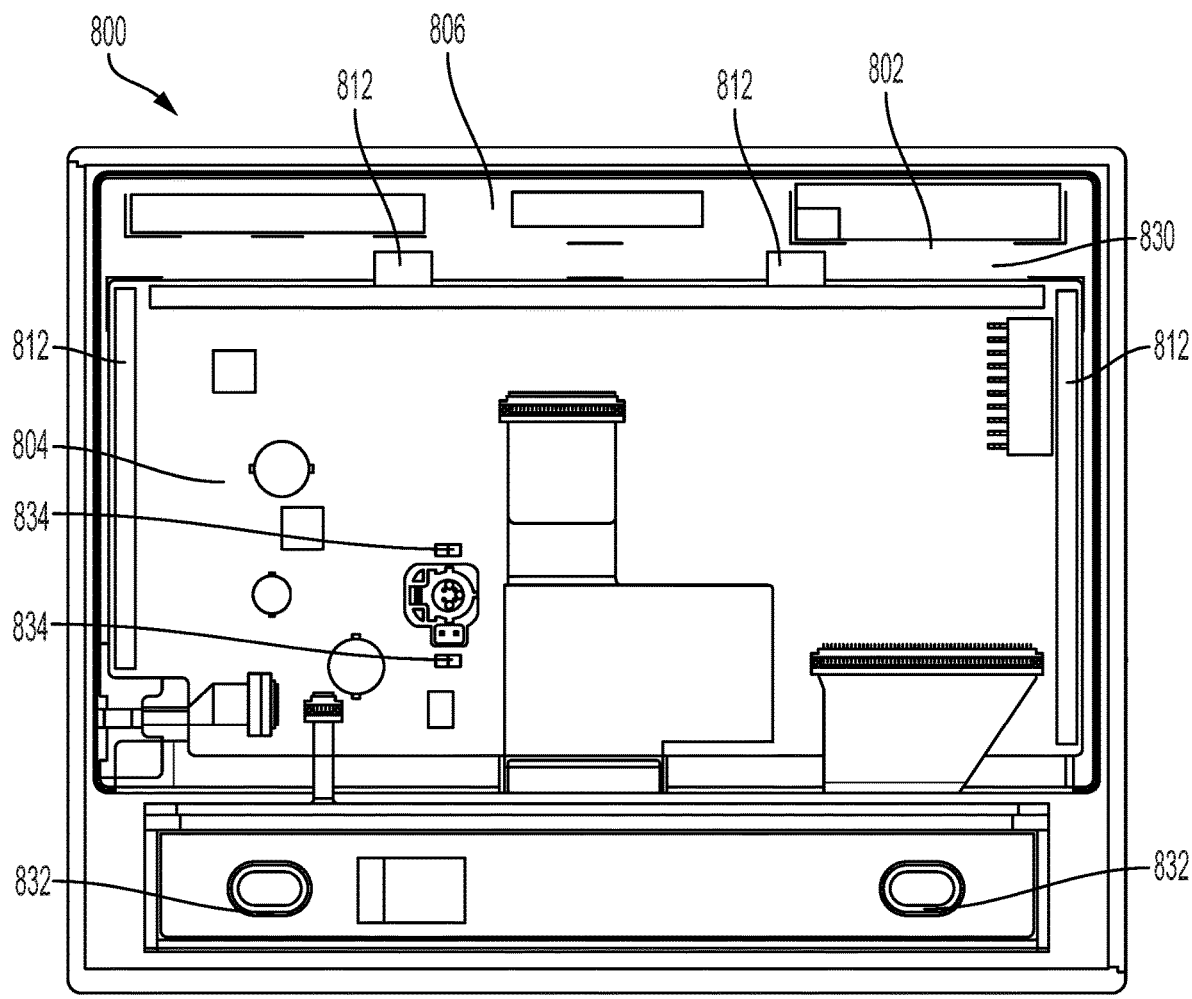
FIG. 8A illustrates a top view of an autonomous vehicle display system, according to one or more example embodiments.

FIG. 8A illustrates a layout of an autonomous vehicle display system 800, according to one or more embodiments. The display system 800 may include a screen 802 which may be the main interface of the display system 800. The screen 802 is illustrated as a top see through layer of FIG. 8A. In one embodiment the screen may be for a light-emitting diode backlit liquid crystal display. The screen may also be a different compatible type of display. For example, the display could be an electroluminescent display, a liquid crystal display, a light emitting diode display, a plasma display, or a quantum dot display. The autonomous vehicle display system 800 may further include a plurality of backlights 832. The plurality of backlights may be LEDs and may be used in a variety of aspects of the display. For example, the backlights may be used for rings around USB connectors to illuminate the USB ports, and/or as a logo backlight. The autonomous vehicle display system 800 may further include a PCB 804. The PCB may include various components including resistors, LEDs, transistors, capacitors, and inductors. In an example embodiment, the PCB may be multi-layered. The autonomous vehicle display system may further include a plurality of USB connector modules 816. The USB connector modules may be configured for connectivity with a user cellular device.

In one embodiment, at least the screen 802, the plurality of backlights 832, the PCB 804, and the plurality of USB connector modules 816 are grounded to the cast housing 806 of the display system 800 through a plurality of pathways 812. The screen 802 and the PCB 804 may be electrically grounded through the same pathway to the cast housing 806. For example, the plurality of pathways may be metal spring finger pins 834. Alternatively, the screen and the PCB may be grounded through different pathways to the cast housing. In addition to electrically grounding the screen 802 and the PCB 804, in an example embodiment, the cast housing 806 may also shield at least the screen 802 and the PCB 804 from electromagnetic interference. The cast housing may be capable of shielding from electromagnetic interference by being made of a metal that blocks electromagnetic waves. In an example embodiment, the metal used for the cast housing may be a metal that is capable of being cast and also effective for shielding against electromagnetic waves. For example, the cast housing may be formed from magnesium. Alternatively, the housing may be cast from aluminum, steel or an alloy thereof. The housing may be cast to provide a shape that covers the electrical components. Alternatively, the housing may be formed in an alternate manner. For example, the housing could be formed by stamping.

Figure 8B:
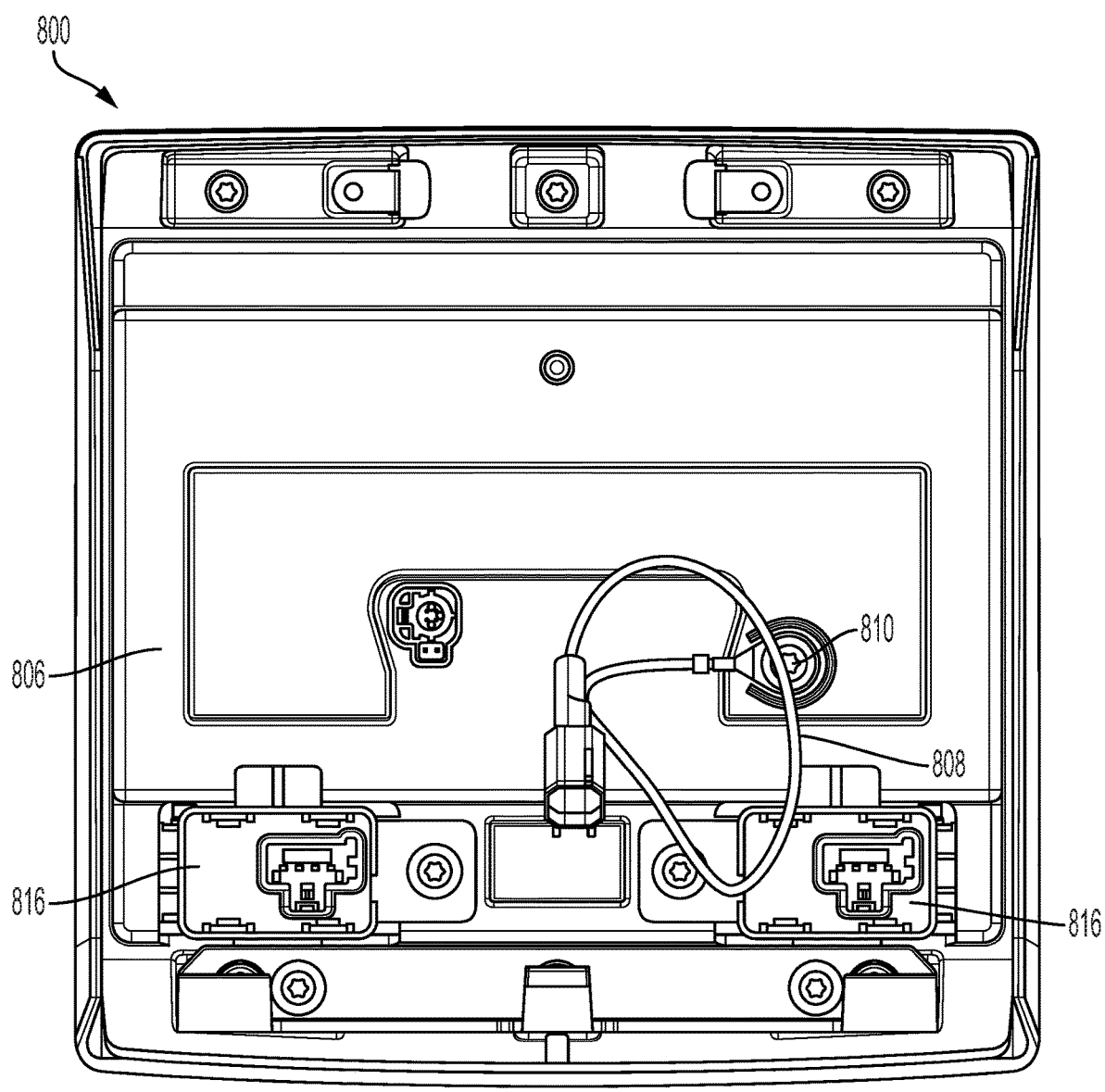
FIG. 8B illustrates a bottom view of an autonomous vehicle display system, according to one or more example embodiments.

In an example embodiment, as shown in FIG. 8B, the autonomous vehicle display system 800 further includes a grounding cable 808 connected to the cast housing 806 and extending to an electrical ground. The grounding cable 808 may discharge electrostatic charge that collects on the display system 800. All of the static from each component may be channeled through the housing to the grounding cable 808. The grounding cable may be made of any suitable material so as to conduct electricity and effectively discharge electrostatic charge on the display system to ground. For example, the cable may be made of a metal such as steel, or aluminum. The grounding cable may be connected to the housing in various manners. In an example embodiment the grounding cable 808 is connected to the cast housing 806 via a self-tapping screw 810. The self-tapping screw is capable of entering the cast housing without the need for a predrilled hole. Additionally, the self-tapping screw does not contribute to debris entering the display system. Alternatively, the grounding cable could be connected to the cast housing with a conductive adhesive, a non-self-tapping screw, a nail, or integrally formed with the cast housing.

During autonomous vehicle operation, a user may be riding in any available seat of the autonomous vehicle. Therefore, it may be beneficial for the autonomous vehicle display system to be accessible in multiple rows of the autonomous vehicle. In an example embodiment, the autonomous vehicle display system 800 may be a second row display system for an autonomous vehicle. Further, in an autonomous vehicle display system, it may be beneficial for user input to operate the vehicle. The autonomous vehicle display system 800 may accept various forms of user input. For example, the autonomous vehicle display system may accept voice commands. Alternatively, the screen 802 of the autonomous vehicle display system 800 may be a touch screen 830 configured to receive user input. However, touch screens are susceptible to a buildup of electrostatic charges from user touch and must therefore have a pathway to discharge through. In an example embodiment, the electrostatic may discharge through the grounding cable. Alternatively, the electrostatic may discharge through other components in the display to ground.

Electromagnetic interference internal to the vehicle may not be the only risk. Interference may come from sources external to the vehicle as well. For example, airports are areas that radiate electromagnetic waves and are likely to cause interference in electrical systems. In an example embodiment, the cast housing 806 may shield at least the screen 802 and the PCB 804 from electromagnetic interference external to the display system 800.

The above detailed description describes various features and functions of the disclosed systems, devices, and methods with reference to the accompanying figures. While various aspects and embodiments have been disclosed herein, other aspects and embodiments will be apparent. The various aspects and embodiments disclosed herein are for purposes of illustration and are not intended to be limiting, with the true scope being indicated by the following claims.

It should be understood that arrangements described herein are for purposes of example only. As such, those skilled in the art will appreciate that other arrangements and other elements (e.g. machines, apparatuses, interfaces, functions, orders, and groupings of functions, etc.) can be used instead, and some elements may be omitted altogether according to the desired results. Further, many of the elements that are described are functional entities that may be implemented as discrete or distributed components or in conjunction with other components, in any suitable combination and location.

What is claimed is:

1. A display system comprising:
a screen;
a printed circuit board (PCB);
a cast housing comprising a metal, wherein at least the screen, and the PCB are grounded to the cast housing through a plurality of grounding pathways, wherein the plurality of grounding pathways at least ground the screen to the PCB and the PCB to the housing, wherein the cast housing includes a first side, wherein the screen and the PCB are disposed on the first side of the cast housing, and wherein the cast housing includes a second side opposite the first side, wherein a plurality of USB connector modules are disposed on the second side of the cast housing, and wherein the cast housing shields at least the screen and the PCB from electromagnetic interference; and
a grounding cable connected to the cast housing via a self-tapping screw, the grounding cable extending to an electrical ground.

2. The display system of claim 1, wherein the screen is a touch screen configured to accept a user input.

3. The display system of claim 1, wherein the display system includes a plurality of pathways through which at least the screen and the PCB are grounded to the cast housing.

4. The display system of claim 3, wherein electrostatic build up on the screen and the PCB is discharged through the plurality of pathways to the grounding cable.

5. The display system of claim 1, further comprising a plurality of USB connector modules grounded to the cast housing.

6. The display system of claim 5, wherein the cast housing shields at least the screen and the PCB from electromagnetic interference from the USB connector modules.

7. The display system of claim 1, further comprising a plurality of electrical components grounded to the cast housing, wherein the plurality of electrical components includes at least a plurality of backlights, the screen, and the PCB.

8. The display system of claim 1, wherein the cast housing includes a plurality of cut outs, and wherein a plurality of USB connector modules extend through the cut outs.

9. The display system of claim 8, wherein the PCB is positioned in a recess of the cast housing.

10. A display system comprising:
a plurality of electrical components, wherein the plurality of electrical components comprise a screen, a PCB, and a plurality of USB connector modules;
a cast housing comprising a metal, wherein the electrical components are grounded to the cast housing through a plurality of pathways, and wherein the plurality of pathways ground at least flail the screen to the PCB and the PCB to the cast housing, wherein the cast housing includes a first side, wherein the screen and the PCB are disposed on the first side of the cast plurality of USB connector modules are disposed on the second side of the cast housing; and
a grounding cable connected to the cast housing, the grounding cable extending to an electrical ground.

11. The display system of claim 10, wherein the grounding cable is copper.

12. The display system of claim 10, wherein the plurality of pathways are grounding layers and wherein electrostatic build up on the plurality of electrical components is discharged through the grounding layers to the grounding cable.

13. The display system of claim 10, wherein the grounding cable is connected to the cast housing via a self-tapping screw.

14. The display system of claim 10, wherein the plurality of pathways comprise metal spring finger pins extending through the PCB to the cast housing.

15. An autonomous vehicle display system comprising:
a screen;
a printed circuit board (PCB);
a plurality of USB connector modules;
a cast housing comprising a metal, wherein at least the screen, the PCB, and the plurality of USB connector modules are grounded to the cast housing through a plurality of grounding pathways, wherein the plurality of grounding pathways at least ground the screen to the PCB and the PCB to the housing, wherein the cast housing includes a first side, wherein the screen and the PCB are disposed on the first side of the cast housing, and wherein the cast housing includes second side opposite the first side, wherein the plurality of USB connector modules are disposed on the second side of the cast housing, and wherein the cast housing shields at least the screen and the PCB from electromagnetic interference; and
a grounding cable connected to the cast housing via a self-tapping screw, the grounding cable extending to an electrical ground.

16. The autonomous vehicle display system of claim 15, wherein the display system is a second row display system of an autonomous vehicle.

17. The autonomous vehicle display system of claim 15, wherein the screen is a touch screen configured to receive user input and wherein electrostatic build up is discharged through the grounding cable.

18. The autonomous vehicle display system of claim 15, wherein the cast housing shields at least the screen and the PCB from electromagnetic interference external to the display system.

19. The autonomous vehicle display system of claim 15, wherein the cast housing comprises magnesium.

* * * * *